United States Patent
Lu et al.

(10) Patent No.: US 7,898,304 B2
(45) Date of Patent: Mar. 1, 2011

(54) MULTIMODE MILLIMETER-WAVE FREQUENCY DIVIDER CIRCUIT WITH MULTIPLE PRESETTABLE FREQUENCY DIVIDING MODES

(75) Inventors: Shey-Shi Lu, Taipei (TW); Hsien-Ku Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/568,828

(22) Filed: Sep. 29, 2009

(65) Prior Publication Data
US 2010/0271082 A1   Oct. 28, 2010

(30) Foreign Application Priority Data
Apr. 22, 2009   (TW) .............................. 98113290 A

(51) Int. Cl.
*H03B 19/06* (2006.01)
(52) U.S. Cl. .................. 327/118; 327/115; 327/117; 377/47
(58) Field of Classification Search ................. 327/115, 327/116, 117, 118, 355–360, 202, 203, 208–212, 327/218; 377/47, 48
See application file for complete search history.

(56) References Cited
U.S. PATENT DOCUMENTS
7,683,687 B2 * 3/2010 Kawashima et al. ........ 327/206

| 2005/0179475 | A1 * | 8/2005 | De Gouy et al. ............. 327/115 |
| 2005/0180539 | A1 * | 8/2005 | De Gouy et al. .............. 377/47 |
| 2008/0278204 | A1 * | 11/2008 | Jang et al. .................... 327/118 |
| 2009/0322386 | A1 * | 12/2009 | Wu ............................. 327/117 |
| 2010/0052739 | A1 * | 3/2010 | Shibata ....................... 327/117 |

* cited by examiner

*Primary Examiner*—Lincoln Donovan
*Assistant Examiner*—Brandon S Cole
(74) *Attorney, Agent, or Firm*—Peter F. Corless; Steven M. Jensen; Edwards Angell Palmer & Dodge LLP

(57) ABSTRACT

A multimode millimeter-wave frequency divider circuit with multiple selectable frequency dividing modes is proposed, which is designed for integration with a millimeter wave (MMW) circuit system, such as a phase-locked loop (PLL) circuit, for providing multimode frequency dividing functions. In actual application, the millimeter wave frequency divider circuit of multi frequency dividing mode provides at least three frequency dividing operational modes, including modes of dividing two, dividing 3 and dividing four. In practice, the millimeter wave frequency divider circuit of multi frequency divider mode may be integrated with a millimeter wave phase-locked circuit to provide a frequency synthetic function having multi frequency sections, such as including 38 GHZ, 60 GHZ and 77 GHZ, and may use reduced circuit layout surfaces and operational power.

20 Claims, 4 Drawing Sheets

MULTIMODE MILLIMETER-WAVE FREQUENCY DIVIDER CIRCUIT WITH MULTIPLE PRESETTABLE FREQUENCY DIVIDING MODES

BACKGROUND OF THE INVENTION

1. Field of the Invention

This invention relates to millimeter wave (MMW), and more particularly, to a multimode millimeter-wave frequency divider circuit with multiple presettable frequency dividing modes which is designed for use with MMW-based circuit systems, such as PLL (phase-locked loop) circuit systems, for providing a multimode frequency dividing function.

2. Description of Related Art

With the advent of wireless digital communication technologies, such as wireless networking, mobile phones, GPS (Global Positioning System), to name just a few, the design and manufacture of MMW (millimeter wave) signal processing circuitry that can handle analog and digital signals within the gigahertz range is in high demand in the electronics industry. Presently, the demand for high-speed MMW signal processing circuitry has advanced to the range from 60 GHz to 77 GHz (gigahertz).

In the design of MMW circuitry, frequency dividers are an essential component used for down-converting an input signal of a high frequency into an output signal of a lower frequency. For high performance purpose, the design of MMW frequency dividers typically requires the capability of frequency locking across a very broad bandwidth. In addition, since most of MMW circuits are to be utilized on portable electronic devices such as mobile phones, the MMW circuit design also requires the capability of low power consumption and compactness in size. In application, frequency dividers are typically integrated to PLL (phase-locked loop) circuitry for synthesis of fixed-frequency signals. Presently, mobile communication systems are operating at the MMW frequencies of 38 GHz, 60 GHz, and 77 GHz. For this sake, the design of MMW IC chips requires the integration of PLL circuitry capable of handing the 38 GHz, 60 GHz, and 77 GHz frequencies.

Presently, one approach to provide multiple-frequency processing capability in one IC chip is to employ three separate PLL circuits respectively used for synthesis of the 38 GHz, 60 GHz, and 77 GHz frequencies. This approach, however, has the drawbacks of requiring large circuit layout space and large power consumption.

SUMMARY OF THE INVENTION

It is therefore an objective of this invention to provide a multimode millimeter-wave frequency divider circuit which is capable of providing multiple presettable frequency-dividing modes based on one single circuit architecture for use with PLL circuits to offer multiple operating frequencies including, for example, 38 GHz, 60 GHz, and 77 GHz, and which can be implemented with less circuit layout space and less power consumption.

In one preferred embodiment, the multimode millimeter-wave frequency divider circuit of the invention is specifically tailored for use with an MMW circuit system, such as a PLL circuit, for providing multiple frequency-dividing modes including dividie-by-2, dividie-by-3, and dividie-by-4 modes for providing 38 GHz, 60 GHz, and 77 GHz operating frequencies.

In circuit architecture, the multimode millimeter-wave frequency divider circuit according to the invention comprises: (A) a first signal injection circuit unit; (B) a second signal injection circuit unit; (C) a third signal injection circuit unit; (D) a crossed-switching circuit unit; (E) a capacitive tuning circuit unit; (F) a first output buffer circuit unit; and (G) a second output buffer circuit unit 220.

In operation, the MMW frequency divider circuit of the invention is capable of providing 3 frequency-dividing modes, including a divide-by-2 frequency-dividing mode, a divide-by-3 frequency-dividing mode, and a divide-by-4 frequency-dividing mode.

In application, the invention has the benefit of using just one single circuit architecture for providing multiple frequency-dividing modes for integration to PLL circuitry for providing multiple operating frequencies in the MMW range, such as 38 GHz, 60 GHz, and 77 GHz. This feature allows the invention to be implemented with less layout space and less power consumption.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The multimode millimeter-wave frequency divider circuit according to the invention is disclosed in full details by way of preferred embodiments in the following with reference to the accompanying drawings.

Functionality of the Invention

Figure 1A:
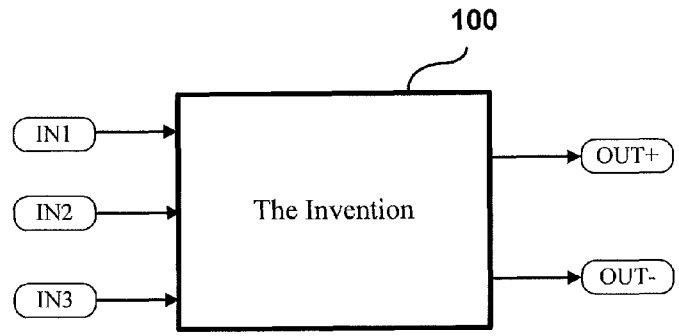
FIGS. 1A and 1B are schematic diagrams used to depict the I/O functional model of the multimode MMW frequency divider circuit of the invention.
Figure 1B:
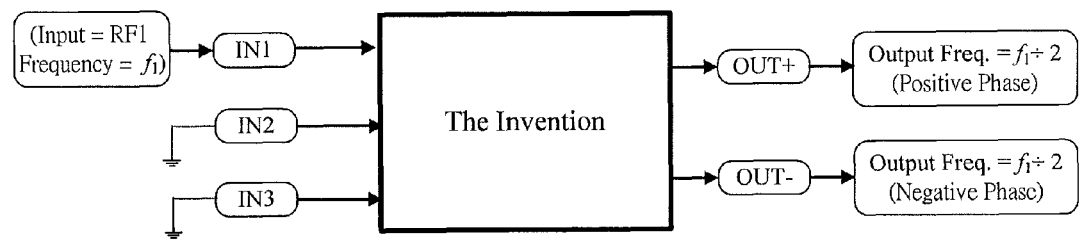
Figure 1B:
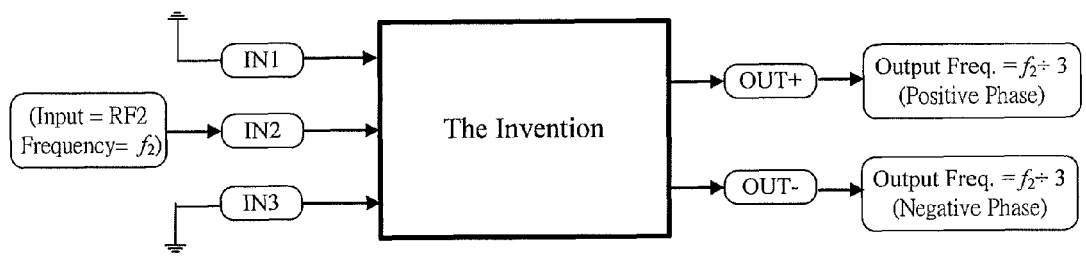
Figure 1B:
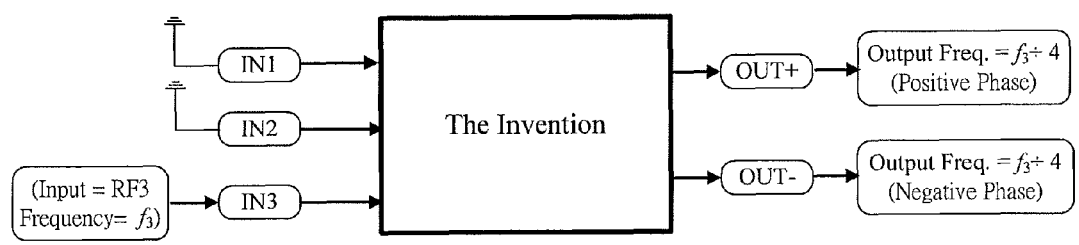

FIGS. 1A and 1B are schematic diagrams used to depict the I/O (input/output) functional model of the multimode MMW frequency divider circuit of the invention (which is here encapsulated in a box labeled with the reference numeral 100). As shown in FIG. 1A, the MMW frequency divider circuit of the invention 100 has an input interface including 3 input ports (IN1, IN2, IN3) and an output interface including a pair of output ports (OUT+, OUT−).

As further shown in FIG. 1B, in operation, the MMW frequency divider circuit of the invention 100 is capable of providing 3 frequency-dividing modes, including a first frequency-dividing mode (divide-by-2), a second frequency-dividing mode (divide-by-3), and a third frequency-dividing mode (divide-by-4).

Under the first frequency-dividing mode, the invention is preset to perform a divide-by-2 frequency dividing operation on an input signal RF1 having a frequency of $f_1$ that is received at the first input port IN1 to thereby generate a pair of differential output signals at the output ports (OUT+, OUT−). Both of the output signals have the same frequency of $f_1 \div 2$ (i.e., the input signal frequency divided by 2), and the two output signals at the output ports (OUT+, OUT−) have a phase difference of 180°.

Under the second frequency-dividing mode, the invention is preset to perform a divide-by-3 frequency dividing operation on an input signal RF2 having a frequency of $f_2$ that is received at the second input port IN2 to thereby generate a pair of differential output signals at the output ports (OUT+, OUT−). Both of the output signals have the same frequency of $f_2 \div 3$ (i.e., the input signal frequency divided by 3), and the two output signals at the output ports (OUT+, OUT−) have a phase difference of 180°.

Under the third frequency-dividing mode, the invention is preset to perform a divide-by-4 frequency dividing operation on an input signal RF3 having a frequency of $f_3$ that is received at the third input port IN3 to thereby generate a pair of differential output signals at the output ports (OUT+, OUT−). Both of the output signals have the frequency of $f_3 \div 4$ (i.e., the input signal frequency divided by 4), and the two output signals at the output ports (OUT+, OUT−) have a phase difference of 180°.

Application of the Invention

Figure 2:
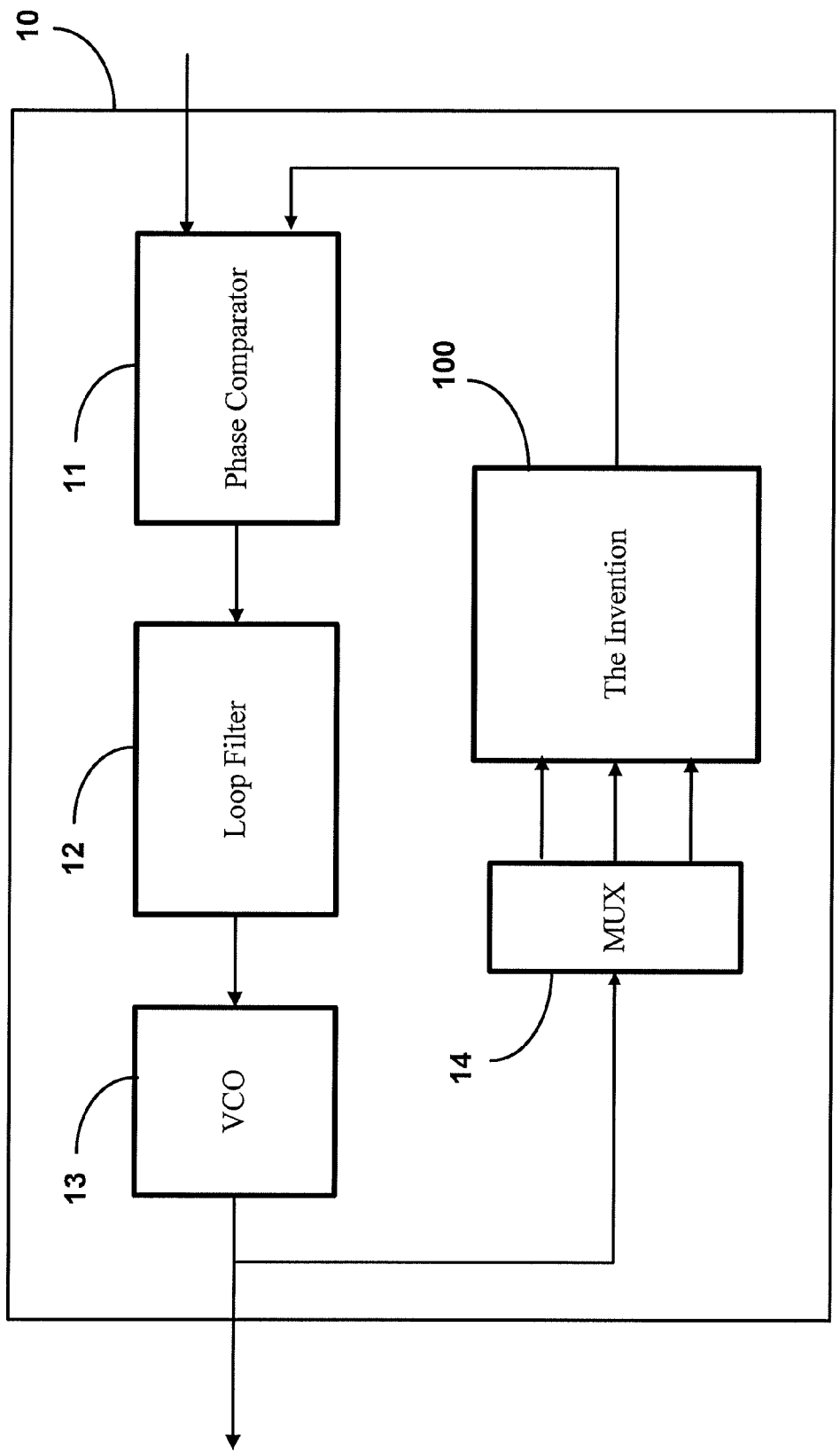
FIG. 2 is a schematic diagram used to depict an application example of the multimode MMW frequency divider circuit of the invention.

FIG. 2 is a schematic diagram showing an application example of the MMW frequency divider circuit of the invention 100. In this application example, the invention is integrated as a circuit component to a PLL (phase-locked loop) circuit, which in addition to the invention is composed of a phase comparator 11, a loop filter 12, and a VCO (voltage-controlled oscillator), and further utilizes a multiplex (MUX) 14 for selecting the operating mode from the 3 available modes, i.e., divide-by-2, divide-by-3, and divide-by-4 modes. Since the PLL is a well-known circuit architecture in the electronics industry, detailed description thereof will not be given in this specification.

Beside the application example shown in FIG. 2, the invention can also be integrated to various other types of circuit systems where multimode MMW frequency dividing function is needed.

Architecture of the Invention

Figure 3:
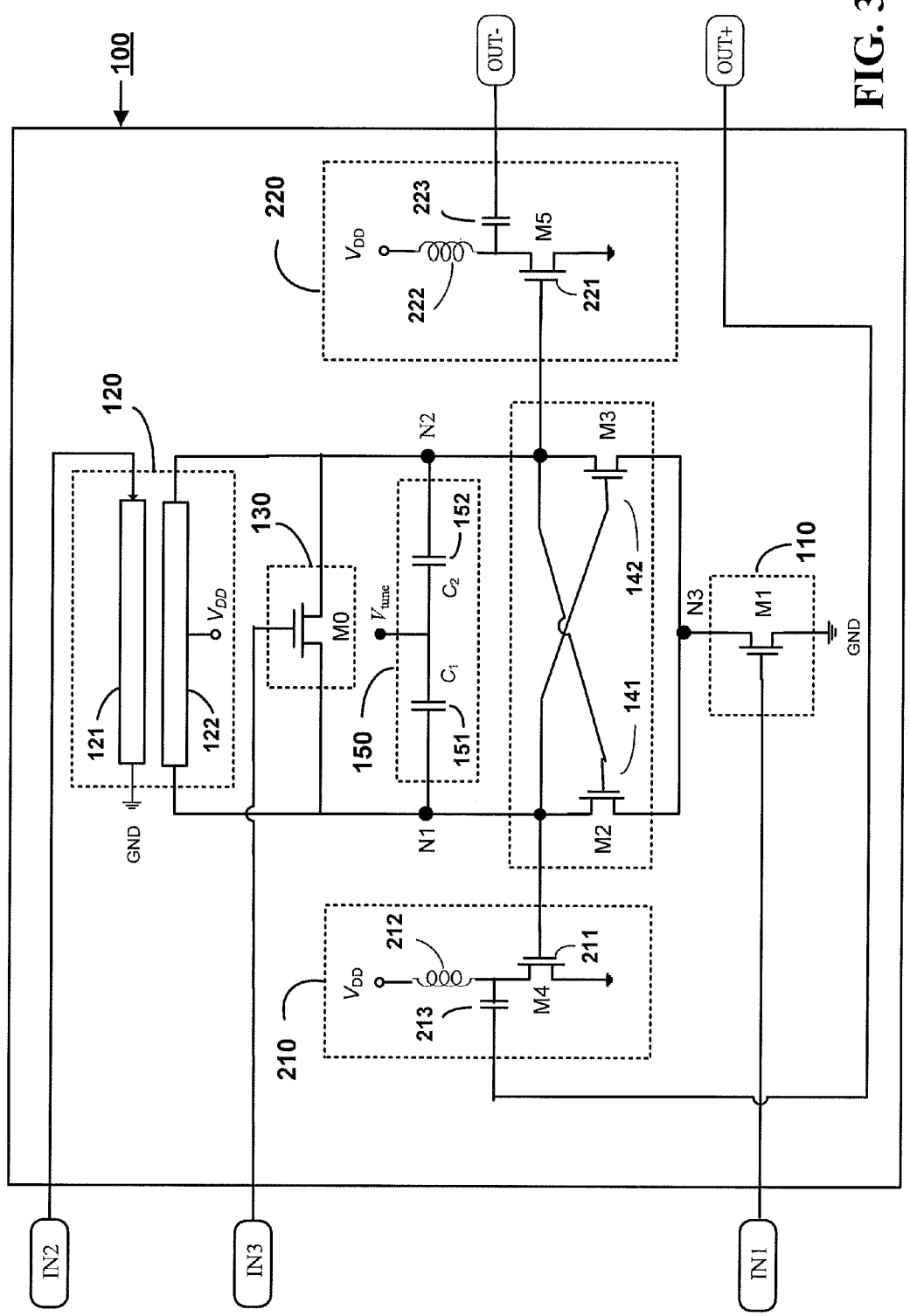
FIG. 3 is a schematic diagram showing the internal circuit architecture of the multimode MMW frequency divider circuit of the invention.

As shown in FIG. 3, in circuit architecture, the MMW frequency divider circuit of the invention 100 comprises: (A) a first signal injection circuit unit 110; (B) a second signal injection circuit unit 120; (C) a third signal injection circuit unit 130; (D) a crossed-switching circuit unit 140; (E) a capacitive tuning circuit unit 150; (F) a first output buffer circuit unit 210; and (G) a second output buffer circuit unit 220. Firstly, the respective attributes and functions of these constituent circuit components of the invention are described in details in the following (A) First Signal Injection Circuit Unit 110

The first signal injection circuit unit 110 is preferably implemented with a switching element, such as an NMOS (N-type metal-oxide semiconductor) or PMOS (P-type metal-oxide semiconductor). In the embodiment of FIG. 3, for example, the switching element is realized by using an NMOS transistor whose gate is connected to the first input port IN1, whose source is connected to the grounding point GND, and whose drain is connected to the third input port IN3.

In actual operation when the first input port IN1 receives the input signal RF1 (frequency=$f_1$), the first signal injection circuit unit 110 will inject the RF1 signal into the third node (N3) through the switching action by the NMOS transistor. The injected signal at the third node (N3) is then bifurcated into two signals.

(B) Second Signal Injection Circuit Unit 120

The second signal injection circuit unit 120 is preferably implemented with a pair of inductive elements, including a first inductive element 121 and a second inductive element 122. In circuit arrangement, the first inductive element 121 and the second inductive element 122 are arranged in such a manner as to form an inductive coupling therebetween, thereby functionally creating a balun (balance-unbalance) circuit architecture. The first inductive element 121 has one end connected to the second input port IN2 and the other end connected to the grounding point GND; while the second inductive element 122 has both of its terminal ends connected respectively to a first node (N1) and a second node (N2) and its middle point connected to a voltage input port $V_{DD}$.

Figure 4:
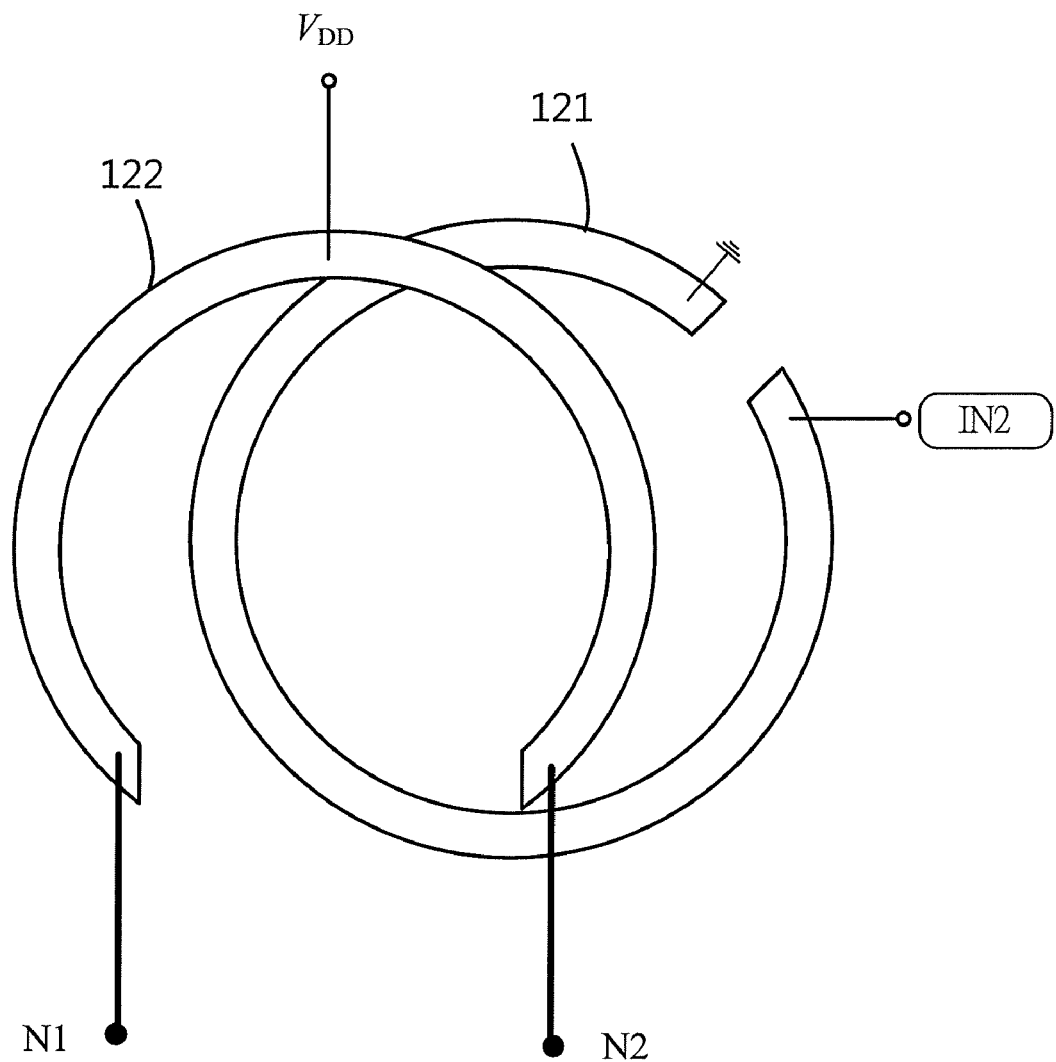
FIG. 4 is a schematic diagram showing the implementation of the second signal injection circuit unit with a ring-shaped microstrip circuit by the invention.

In actual realization, the first inductive element 121 and the second inductive element 122 are preferably implemented with a ring-shaped microstrip circuit architecture as shown in FIG. 4. In this circuit architecture, the first inductive element 121 is implemented with a first microstrip having a thickness of 3.3 μm (millimeter), while the second inductive element 122 is implemented with a second microstrip having a thickness of 0.83 μm.

In operation, when the second node (N2) receives the input signal RF2 (frequency=$f_2$), the second signal injection circuit unit 120 will inject the RF2 signal by way of the inductive coupling between the first inductive element 121 and the second inductive element 122 into the first node (N1) and the second node (N2). During this injection process, the balun circuit architecture of the second signal injection circuit unit 120 can help prevent the oscillation signal induced by the injected signal from leaking back to the second input port IN2.

(C) Third Signal Injection Circuit Unit 130

The third signal injection circuit unit 130 is preferably implemented with a switching element, such as an NMOS or a PMOS transistor. In the embodiment of FIG. 3, for example, the switching element is realized by using an NMOS transistor whose gate is connected to the third input port IN3 and whose source and drain are connected respectively to the first node (N1) and the second node (N2).

In operation, when the third input port IN3 receives the input signal RF3 (frequency =$f_3$), the third signal injection circuit unit 130 will inject the RF3 signal into the first node (N1) and the second node (N2) through the switching action by the NMOS transistor.

(D) Crossed-Switching Circuit Unit 140

The crossed-switching circuit unit 140 is composed of a pair of crossly interconnected switching elements, such as a pair of NMOS transistors or a pair of PMOS transistors. In the embodiment of FIG. 3, the paired switching elements are realized by using a pair of NMOS transistors 141, 142 (which are designed by M2 and M3 respectively in FIG. 3). These two NMOS transistors 141, 142 have their gates (control terminals) connected respectively to the second node (N2) and the first node (N1), their sources (first connecting terminals) connected together to the third node (N3), and their drains (second connecting terminals) connected respectively to the first node (N1) and the second node (N2).

In operation, this crossed-switching circuit unit 140 is capable of performing a crossed-switching operation on the oscillation signal induced by the injected signal at the first node (N1) and the second node (N2).

(E) Capacitive Tuning Circuit Unit 150

The capacitive tuning circuit unit 150 is preferably implemented with a first capacitive element ($C_1$) 151 and a second capacitive element ($C_2$) 152. In circuit arrangement, the first capacitive element ($C_1$) 151 has one end connected to a tuning voltage input port and the other end connected to the first node (N1); while the second capacitive element ($C_2$) 152 has one end connected to the tuning voltage input port $V_{tune}$ and the other end connected to the second node (N2).

Functionally, an LC-based oscillation circuit is constituted by the combination of the first capacitive element ($C_1$) 151 and the second capacitive element ($C_2$) 152 with the second inductive element 122 of the second signal injection circuit unit 120. In operation, this LC-based oscillation circuit can respond to the input of a tuning voltage $V_{tune}$ by generating an oscillation signal of a fixed frequency (represented by $f_0$) serving as a local oscillation signal.

(F) First Output Buffer Circuit Unit 210

The first output buffer circuit unit 210 is implemented with a switching element 211 (which is realized by using a NMOS transistor in the embodiment of FIG. 3), an inductive circuit element 212, and a capacitive circuit element 213. In circuit arrangement, the switching element (NMOS) 211 has its gate connected to the first node (N1), its source connected to the grounding point GND, and its drain connected to one end of the inductive circuit element 212. The inductive circuit element 212 has one end connected to the system voltage input port $V_{DD}$ and the other end connected to the drain of the switching element (NMOS) 211. The capacitive circuit element 213 has one end connected to the positive differential signal output port OUT+ and the other end connected to the drain of the switching element (NMOS) 211.

In operation, the first output buffer circuit unit 210 is capable of handling the oscillation signal at the first node (N1) for outputting from the output port OUT+ as a positive differential signal.

(G) Second Output Buffer Circuit Unit 220

The second output buffer circuit unit 220 is entirely identical in circuit architecture as the above-mentioned first output buffer circuit unit 210, which is also implemented with a switching element 221 (which is realized by using a NMOS transistor in the embodiment of FIG. 3), an inductive circuit element 222, and a capacitive circuit element 223. In circuit arrangement, the switching element (NMOS) 221 has its gate connected to the second node (N2), its source connected to the grounding point GND, and its drain connected to one end of the inductive circuit element 222. The inductive circuit element 222 has one end connected to the system voltage input port $V_{DD}$ and the other end connected to the drain of the switching element (NMOS) 221. The capacitive circuit element 223 has one end connected to the negative differential signal output port OUT- and the other end connected to the drain of the switching element (NMOS) 221.

In operation, the second output buffer circuit unit 220 is used to handle the oscillation signal at the second node (N2) and output the oscillation signal from the output port OUT- as a negative differential signal.

Operation of the Invention

As mentioned earlier, the MMW frequency divider circuit of the invention 100 is capable of providing 3 frequency-dividing modes of operation: divide-by-2, divide-by-3, and divide-by-4 frequency-dividing modes. The following is a detailed description of the operation of each of these three modes.

(Mode 1) Divide-by-2 Operation

Under the first frequency-dividing mode (divide-by-2), the input signal whose frequency is to be down-converted by a factor of 2 is directed for reception at the first input port IN1, with the second input port IN2 and the second input port IN2 being preset for connection to the grounding point GND.

During operation when the first input port IN1 receives the input signal RF1, it will cause the third node (N3) to generate an induced oscillation signal through the switching action by the NMOS transistor (M1). This induced oscillation signal is then bifurcated into two signals which are respectively directed to the source of the NMOS transistor (M2) and the source of the NMOS transistor (M3), thereby causing these two NMOS transistors (M2, M3) to produce a pair of oscillation signals through cross-switched actions respectively at the first node (N1) and the second node (N2).

At the same time, the LC-based oscillation circuit (which is constituted by the combination of the second signal injection circuit unit 120 and the capacitive tuning circuit unit 150) generates a local oscillation signal $f_0$ which is then mixed respectively with the two crossly-switched oscillation signals at the first node (N1) and the second node (N2).

The mixed signal at the first node (N1) is then handled by the first output buffer circuit unit 210 for outputting via the output port OUT+ as a divide-by-2 positive differential signal whose frequency is half of the input signal RF1 (i.e., $f_1 \div 2$). At the same time, the mixed signal at the second node (N2) is concurrently handled by the second output buffer circuit unit 220 for outputting via the output port OUT- as a divide-by-2 negative differential signal whose frequency is also half of the input signal RF1 (i.e., $f_1 \div 2$) but whose phase lags the phase of the output signal at OUT+ by 180°.

It is to be noted that, in the above operation, the frequency $f_1$ of the input signal RF1 can vary within a tolerable range $\Delta f$ and still can be locked to produce the desired divide-by-2 output signal.

(Mode 2) Divide-by-3 Operation

Under the second frequency-dividing mode (divide-by-3), the input signal RF2 whose frequency $f_2$ is to be down-converted by a factor of 3 is directed for reception at the second input port IN2, with the first input port IN1 and the third input port IN3 being preset for connection to the grounding point GND.

During actual operation when the second input port IN2 receives the input signal RF2, the input signal RF2 will first flow into the first inductive element 121 of the second signal injection circuit unit 120, whereupon an oscillation signal having the same frequency is induced at the second inductive element 122 through inductive coupling. This induced signal is then bifurcated into two signals flowing respectively to the first node (N1) and the second node (N2). At the same time, the local oscillation signal $f_0$ causes the third node (N3) to produce even-mode harmonics, thereby allowing the frequency signal injected by the second signal injection circuit unit 120 at the third node (N3) to be mixed with the even-mode harmonics through the crossed-switching operation by the crossed-switching circuit unit 140. The mixed signal is then fed back via the crossed-switching circuit unit 140 to the first node (N1) and the second node (N2).

The mixed signal at the first node (N1) is then handled by the first output buffer circuit unit 210 for outputting from the output port OUT+ as a divide-by-3 positive differential signal whose frequency is ⅓ of the frequency of the input signal RF2. At the same time, the mixed signal at the second node (N2) is concurrently handled by the second output buffer circuit unit 220 for outputting via the output port OUT- as a divide-by-3 negative differential signal whose frequency is also ⅓ of the input signal RF2 (i.e., $f_2 \div 3$) but whose phase lags the phase of the output signal at OUT+ by 180°.

It is to be noted that, in the above operation, the frequency $f_2$ of the input signal RF2 can vary within a tolerable range $\Delta f$ and still can be locked to produce the desired divide-by-3 output signal.

(Mode 3) Divide-by-4 Operation

Under the third frequency-dividing mode (divide-by-4), the input signal RF3 whose frequency $f_3$ is to be down-converted by a factor of 4 is directed for reception at the third node (N3), with the first input port IN1 and the second input port IN2 being preset for connection to the grounding point GND.

During actual operation when the third input port IN3 receives the input signal RF3, the received signal will be injected by the NMOS transistor of the third signal injection circuit unit 130 into the first node (N1) and the second node (N2). The injected signal is then mixed with the local oscillation signal $f_0$ generated by the LC-based oscillation circuit constituted by the second signal injection circuit unit 120 and the capacitive tuning circuit unit 150. Subsequently, the mixed signal undergoes a crossed-switching operation performed by the crossed-switching circuit unit 140, thereby producing a new oscillation signal.

The resultant oscillation signal at the first node (N1) is then handled by the first output buffer circuit unit 210 for outputting via the output port OUT+ as a divide-by-4 positive differential signal whose frequency is ¼ of the input signal RF3 (i.e., $f_3 \div 4$). At the same time, the resultant oscillation signal at the second node (N2) is concurrently handled by the second output buffer circuit unit 220 for outputting via the output port OUT− as a divide-by-4 negative differential signal whose frequency is also ¼ of the input signal RF3 (i.e., $f_3 \div 4$) but whose phase lags the phase of the positive differential signal at OUT+ by 180°.

It is to be noted that, in the above operation, the frequency $f_3$ of the input signal RF3 can vary within a tolerable range $\Delta f$ and still can be locked to produce the desired divide-by-4 output signal.

In practice, the invention can be realized by using the 0.13 μm CMOS (Complementary Metal-Oxide Semiconductor) fabrication technology, which allows the use of a low system voltage of 1 V (volt) such that power consumption is as low as 3.12 mW. In addition, the invention allows the use of a single circuit architecture for providing multiple frequency-dividing modes for integration to PLL circuitry for selective operation at 38 GHz, 60 GHz, and 77 GHz. These features allow the invention to be implemented with less layout space and less power consumption.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multimode millimeter-wave frequency divider circuit, which comprises:
   a signal input interface having at least a first input port, a second input port, a third input port, and a tuning voltage input port;
   a signal output interface having at least a pair of differential signal output ports, including a positive differential signal output port and a negative differential signal output port; and
   a frequency-dividing processing module, which in the case of an input signal appearing at the first input port is capable of performing a divide-by-2 frequency-dividing operation on the input signal; in the case of an input signal appearing at the second input port, is capable of performing a divide-by-3 frequency-dividing operation on the input signal; and in the case of an input signal appearing at the third input port is capable of performing a divide-by-4 frequency-dividing operation on the input signal; and which is further capable of outputting the frequency-downconverted signal through the signal output interface.

2. The multimode millimeter-wave frequency divider circuit of claim 1, wherein the frequency-dividing processing module includes:
   a first signal injection circuit unit, which is connected to the first input port for injecting the input signal received at the first input port into a third node through a switching operation;
   a second signal injection circuit unit, which is constructed on a balun-based circuit architecture and is connected to the second input port for injecting the input signal received at the second input port into a first node and a second node through inductive coupling;
   a third signal injection circuit unit, which is connected to the third input port for injecting the input signal received at the third input port into the first node and the second node through a switching operation;
   a crossed-switching circuit unit, which is connected across the first node, the second node, and the third node, and is capable of performing a crossed-switching operation on the oscillation signals induced at the first node and the second node based on an oscillation signal induced at the third node;
   a capacitive tuning circuit unit, which is connected across the first node and the second node, and which in combination with the balun-based circuit architecture of the second signal injection circuit unit constitutes an LC-based oscillation circuit capable of responding to an input of a tuning voltage by generating a local oscillation signal;
   a first output buffer circuit unit, which is connected between the first node and the positive differential signal output port for outputting the oscillation signal induced at the first node as a positive differential signal; and
   a second output buffer circuit unit, which is connected between the second node and the negative differential signal output port for outputting the oscillation signal induced at the second node as a negative differential signal.

3. The multimode millimeter-wave frequency divider circuit of claim 1, which is used for integration to a millimeter-wave (MMW) circuit system.

4. The multimode millimeter-wave frequency divider circuit of claim 2, wherein the MMW circuit system is a PLL (phase-locked loop) circuit.

5. The multimode millimeter-wave frequency divider circuit of claim 3, wherein the PLL circuit is used for synthesis of multiple frequencies including 38 GHz, 60 GHz, and 77 GHz.

6. The multimode millimeter-wave frequency divider circuit of claim 1, wherein the first signal injection circuit unit is an NMOS-based signal injection circuit.

7. The multimode millimeter-wave frequency divider circuit of claim 1, wherein the first signal injection circuit unit is a PMOS-based signal injection circuit.

8. The multimode millimeter-wave frequency divider circuit of claim 1, wherein the balun-based circuit architecture of the second signal injection circuit unit is implemented with a pair of inductively-coupled ring-shaped microstrips.

9. The multimode millimeter-wave frequency divider circuit of claim 1, wherein the third signal injection circuit unit is an NMOS-based signal injection circuit.

10. The multimode millimeter-wave frequency divider circuit of claim 1, wherein the third signal injection circuit unit is a PMOS-based signal injection circuit.

11. The multimode millimeter-wave frequency divider circuit of claim 1, wherein the crossed-switching circuit unit is an NMOS-based crossed-switching circuit.

12. The multimode millimeter-wave frequency divider circuit of claim 1, wherein the crossed-switching circuit unit is a PMOS-based crossed-switching circuit.

13. The multimode millimeter-wave frequency divider circuit of claim 1, wherein the first output buffer circuit unit is an NMOS-based output buffer circuit.

14. The multimode millimeter-wave frequency divider circuit of claim 1, wherein the first output buffer circuit unit is a PMOS-based output buffer circuit.

15. The multimode millimeter-wave frequency divider circuit of claim 1, wherein the second output buffer circuit unit is an NMOS-based output buffer circuit.

16. The multimode millimeter-wave frequency divider circuit of claim 1, wherein the second output buffer circuit unit is a PMOS-based output buffer circuit.

17. The multimode millimeter-wave frequency divider circuit of claim 1, which is implemented with any process fabrication technology.

18. A multimode millimeter-wave frequency divider circuit, which comprises:
- a signal input interface having at least a first input port, a second input port, a third input port, and a tuning voltage input port;
- a signal output interface having at least a pair of differential signal output ports, including a positive differential signal output port and a negative differential signal output port; and
- a first signal injection circuit unit, which is connected to the first input port for injecting the input signal received at the first input port into a third node by means of a switching operation;
- a second signal injection circuit unit, which is constructed on a balun-based circuit architecture and is connected to the second input port for injecting the input signal received at the second input port into a first node and a second node by means of inductive coupling;
- a third signal injection circuit unit, which is connected to the third input port for injecting the input signal received at the third input port into the first node and the second node by means of a switching operation;
- a crossed-switching circuit unit, which is connected across the first node, the second node, and the third node, and is capable of performing a crossed-switching operation for oscillation signals induced at the first node and the second node based on an oscillation signal induced at the third node;
- a capacitive tuning circuit unit, which is connected across the first node and the second node, and which in combination with the balun-based circuit architecture of the second signal injection circuit unit constitutes an LC-based oscillation circuit capable of responding to an input of a tuning voltage by generating a local oscillation signal;
- a first output buffer circuit unit, which is connected between the first node and the positive differential signal output port for outputting the oscillation signal induced at the first node as a positive differential signal; and
- a second output buffer circuit unit, which is connected between the second node and the negative differential signal output port for outputting the oscillation signal induced at the second node as a negative differential signal.

19. The multimode millimeter-wave frequency divider circuit of claim 18, wherein the PLL circuit is used for synthesis of multiple frequencies including 38 GHz, 60 GHz, and 77 GHz.

20. The multimode millimeter-wave frequency divider circuit of claim 18, wherein the balun-based circuit architecture of the second signal injection circuit unit is implemented with a pair of inductively-coupled ring-shaped microstrips.

* * * * *